US007181358B2

(12) United States Patent
Kolman et al.

(10) Patent No.: US 7,181,358 B2
(45) Date of Patent: Feb. 20, 2007

(54) METHOD, APPARATUS AND DATABASE USING A MAP OF LINKED DATA NODES FOR STORING TEST NUMBERS

(75) Inventors: Robert S. Kolman, Longmont, CO (US); Reid Hayhow, La Porte, CO (US)

(73) Assignee: Verigy Pte. Ltd., Singapore (SG)

( * ) Notice: Subject to any disclaimer, the term of this patent is extended or adjusted under 35 U.S.C. 154(b) by 227 days.

(21) Appl. No.: 10/839,890

(22) Filed: May 5, 2004

(65) Prior Publication Data

US 2005/0251357 A1 Nov. 10, 2005

(51) Int. Cl.
*G06F 19/00* (2006.01)
(52) U.S. Cl. ...................... 702/108; 702/119
(58) Field of Classification Search ................ 702/108, 702/109, 119, 122; 717/114, 121, 143; 707/9, 707/100; 706/48
See application file for complete search history.

(56) References Cited

U.S. PATENT DOCUMENTS 5,491,694 A * 2/1996 Oliver et al. ................ 370/455
2005/0262080 A1 * 11/2005 Kolman et al . ................ 707/9

OTHER PUBLICATIONS

Robert S. Kolman, et al. "Method and Apparatus for Assigning Test Numbers", filed May 5, 2004, U.S. Patent Application (18 pages of specification, 6 sheets of drawings (Figs. 1-9).
Robert S. Kolman, et al. "Methods and Apparatus That Use Contextual Test Number Factors to Assign Test Numbers", filed May 5, 2004, U.S. Patent Application (27 pages of specification, 8 sheets of drawings (Figs. 1-13).
Robert S. Kolman, et al. "Methods and Apparatus That Use Contextual Test Number Factors to Assign Test Numbers", filed May 5, 2004, U.S. Patent Application (25 pages of specification, 7 sheets of drawings (Figs. 1-10).
Robert S. Kolman, et al. "Methods and Apparatus for Identifying Test Number Collisions", filed May 5, 2004, U.S. Patent Application (22 pages of specification, 7 sheets of drawings (Figs. 1-10).
Robert S. Kolman, et al. "Methods and Apparatus for Handling Test Number Collisions", filed May 5, 2004, U.S. Patent Application (28 pages of specification, 9 sheets of drawings (Figs. 1-12).

* cited by examiner

*Primary Examiner*—Bryan Bui

(57) ABSTRACT

In a method for assigning test numbers, current testflow context information is maintained during execution of a testflow. The information is maintained as an array of one or more context values. Upon execution of a subtest in the testflow, a map of linked data nodes is indexed using a key formed from 1) a numeric identifier of the subtest, and 2) the array of context values. If a data node corresponding to the key exists in the map and is associated with a test number, the data node's test number is assigned to a result of the subtest; else, a new test number is assigned to the result of the subtest, and the new test number is associated with a data node that is linked in the map. A test number database, and a test number engine for satisfying calls for test numbers, are also disclosed.

16 Claims, 5 Drawing Sheets

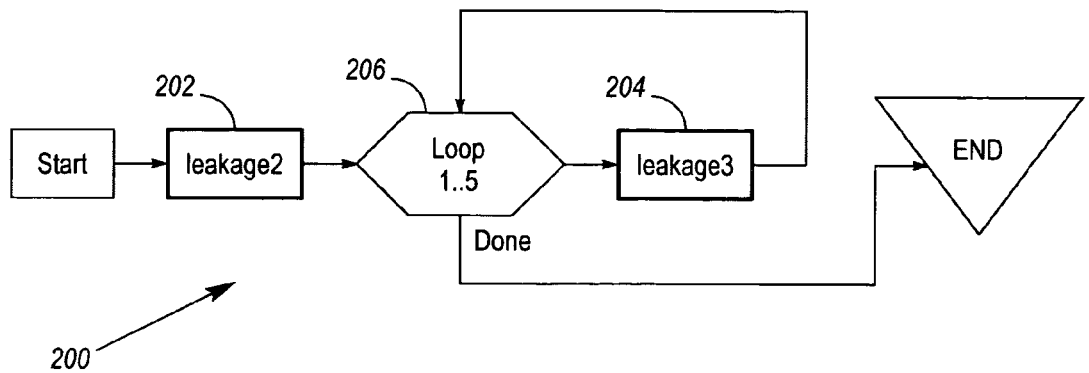
FIG. 2
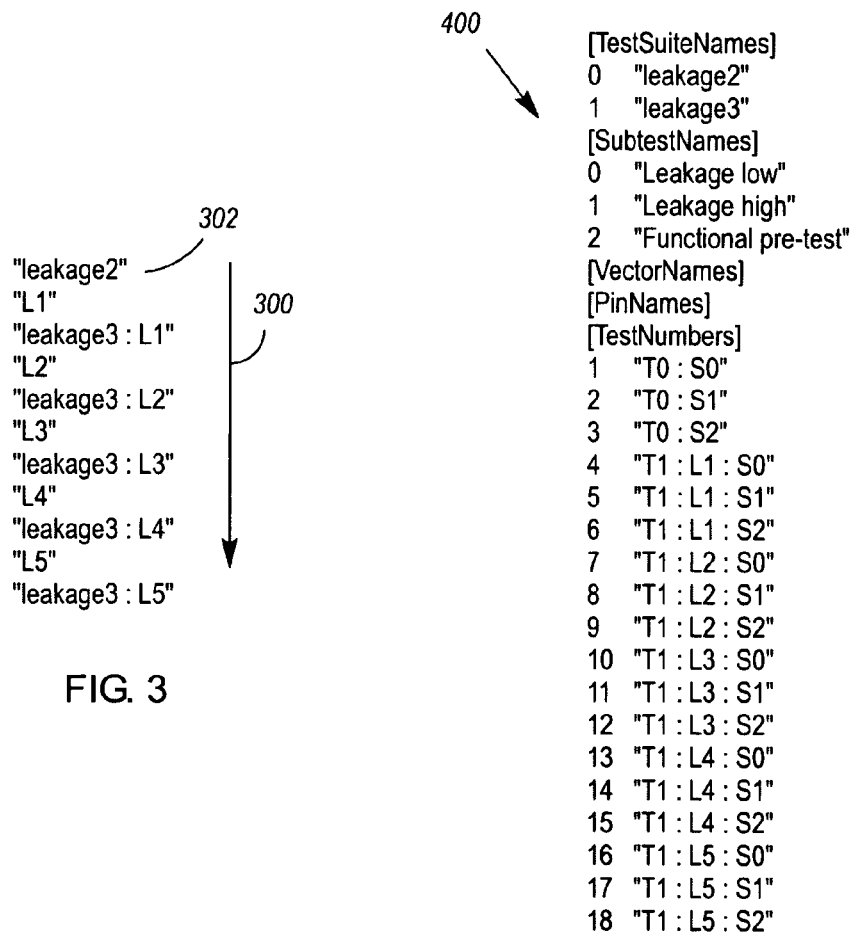
FIG. 3
FIG. 4

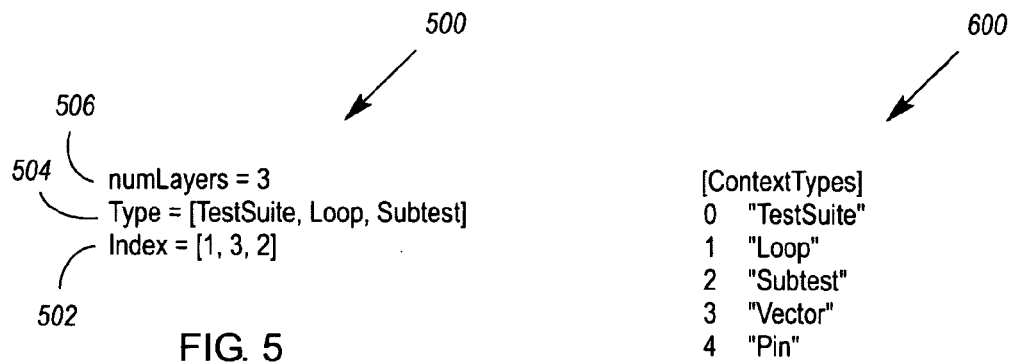
FIG. 5
FIG. 6
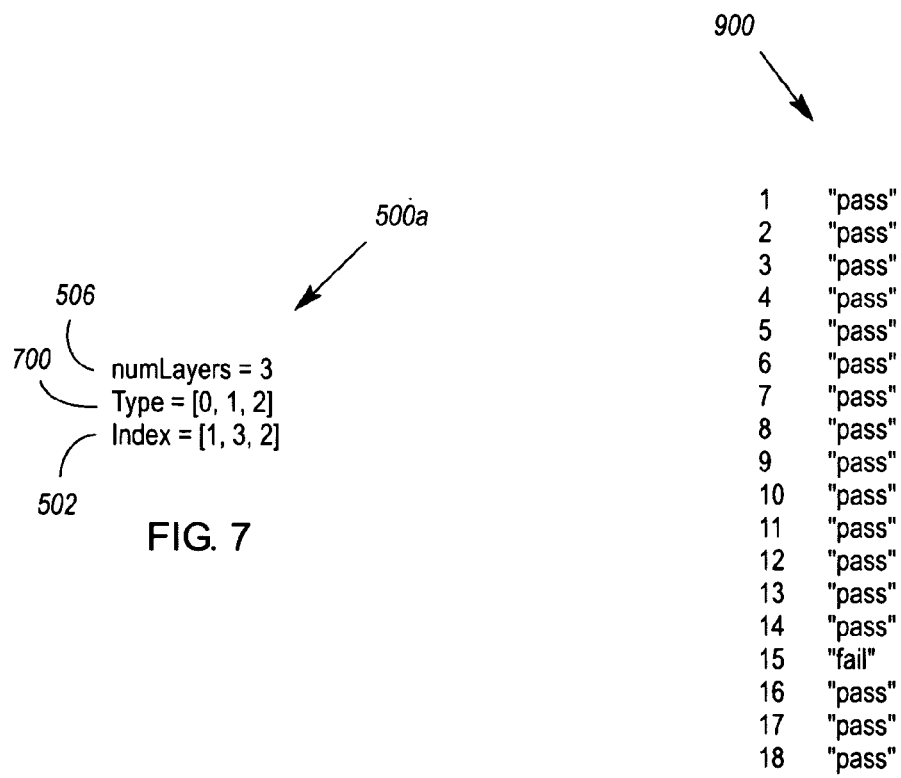
FIG. 7
FIG. 9

METHOD, APPARATUS AND DATABASE USING A MAP OF LINKED DATA NODES FOR STORING TEST NUMBERS

BACKGROUND OF THE INVENTION

Some forms of circuit test provide an engineer with large volumes of test results. To assist the engineer in managing and referring to these test results, each test result may be associated with a test number.

The U.S. patent application of Robert S. Kolman, et al. entitled "Method and Apparatus for Assigning Test Numbers" (Ser. No. 10/839,887 filed May 5, 2004) discloses a method for assigning test numbers wherein current testflow context information is maintained during the execution of a testflow. Upon execution of a subtest in the testflow, a database of test numbers is indexed using index information comprising 1) an identifier of the subtest, and 2) the current testflow context information. If a test number corresponding to the index information exists in the database, the test number is assigned to a result of the subtest. If a test number corresponding to the index information does not exist in the database, a new test number is assigned to the result of the subtest, and the index information and new test number are associated in the database.

SUMMARY OF THE INVENTION

One aspect of the invention is embodied in a method for assigning test numbers. In accordance with the method, current testflow context information is maintained during the execution of a testflow. The information is maintained as an array of one or more context values. Upon execution of a subtest in the testflow, a map of linked data nodes is indexed using a key formed from 1) a numeric identifier of the subtest, and 2) the array of context values. If a data node corresponding to the key exists in the map and is associated with a test number, the data node's test number is assigned to a result of the subtest; else, a new test number is assigned to the result of the subtest, and the new test number is associated with a data node that is linked in the map.

Another aspect of the invention is embodied in a test number database. The database comprises a plurality of linked data nodes, at least one of which is a test suite node that points to at least one other data node, and at least one of which is a test number node that is pointed to by another data node. Each of one or more test numbers is associated with one of said test number nodes.

Yet another aspect of the invention is embodied in a test number engine. The test number engine comprises computer readable media, and program code that is stored on the computer readable media. The program code comprises code to, in response to a call for a test number, index a map of linked data nodes using a key formed from 1) a numeric identifier of a subtest, and 2) an array of one or more current testflow context values. The program code further comprises code to, upon indexing a data node associated with a test number, satisfy the call by returning the test number. In addition, the program code comprises code to, upon a miss in indexing the map, generate a new test number; satisfy the call by returning the new test number; and associate the new test number with a data node that is linked in the map.

Other embodiments of the invention are also disclosed.

BRIEF DESCRIPTION OF THE DRAWINGS

Illustrative and presently preferred embodiments of the invention are illustrated in the drawings, in which:

FIG. 2 illustrates an exemplary testflow;

FIG. 3 illustrates a progression of testflow context information for the FIG. 2 testflow;

FIG. 4 illustrates a database of look-up tables for converting strings of testflow context information for the FIG. 2 testflow to numeric equivalents;

FIG. 5 illustrates an exemplary key for indexing a map of linked data nodes;

FIG. 6 illustrates a look-up table for converting strings in the Type array of the FIG. 5 key to numeric equivalents;

FIG. 7 illustrates an alternative embodiment of the FIG. 5 key;

FIG. 9 illustrates a database of test results that may be generated in response to execution of the FIG. 2 testflow.

DESCRIPTION OF THE PREFERRED EMBODIMENT

Figure 1:
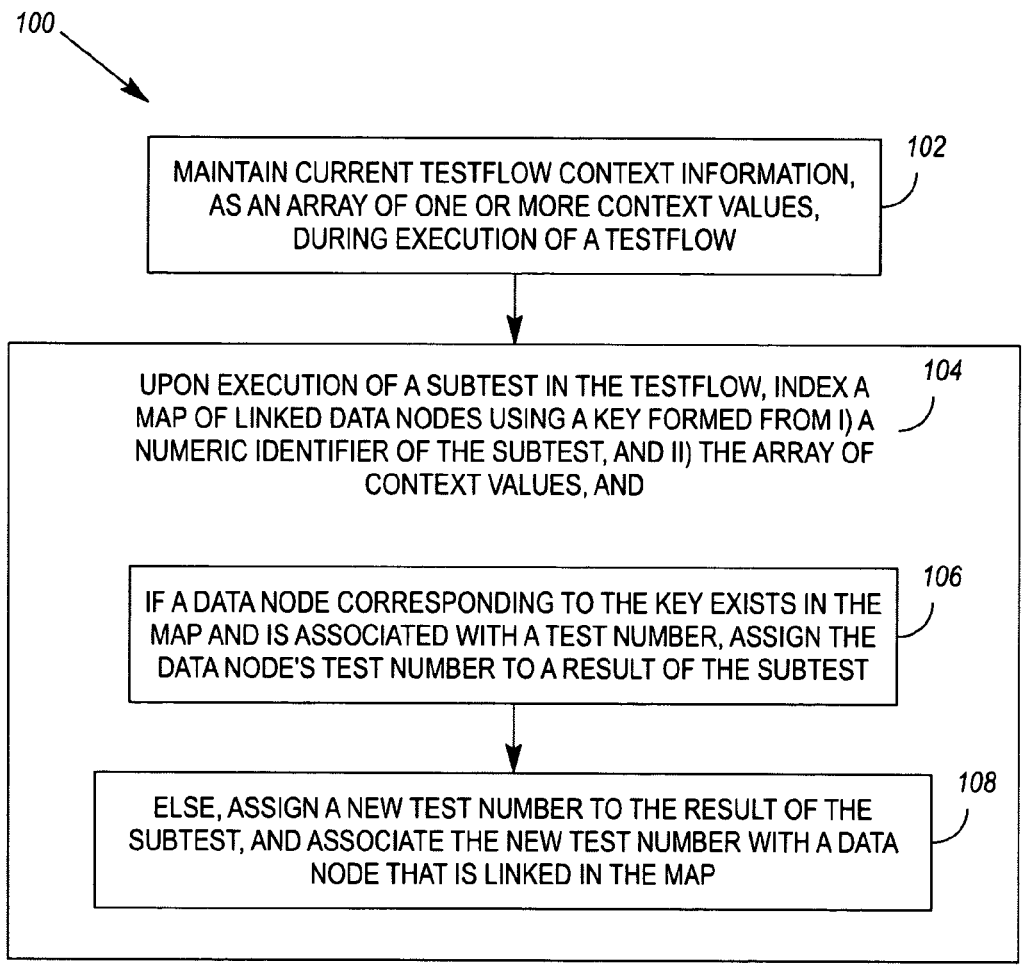
FIG. 1 illustrates an exemplary method for assigning test numbers.

FIG. 1 illustrates a method 100 for assigning test numbers. In accordance with the method 100, current testflow context information is maintained 102 during the execution of a testflow. The information is maintained as an array of one or more context values. As defined herein, a "testflow" is any portion of a test program that is used to specify the type, number or order of tests that may be executed during circuit test. Testflow context information may comprise any information that assists in defining what portion of a test program is being executed. By way of example, testflow context information may comprise information such as a test suite designator, a port designator, a vector label, a vector designator, or a pin designator. Testflow context information may also comprise a loop designator and/or loop iteration designator for each of a number of loop layers (e.g., nested loops) that have been entered during execution of a testflow. As used herein, the term "designator" encompasses a string, number or any other means that can be used to designate a test suite, loop or other testflow context. A "context value" is defined to be any sort of numeric equivalent for a component of testflow context information and, by way of example, a context value might be an integer or a direct memory reference.

During execution of a testflow, one or more subtests will eventually be executed. A "subtest", as defined herein, may be a test that produces multiple test results, but is preferably a test or portion of a test that produces only a single test result.

Upon execution of a subtest, the method 100 continues with the indexing 104 of a map of linked data nodes using a key formed from 1) a numeric identifier of the subtest, and 2) the array of context values. If a data node corresponding to the key exists in the map and is associated with a test number, the data node's test number is assigned 106 to a result of the subtest; else, a new test number is assigned 108 to the result of the subtest, and the new test number is associated with a data node that is linked in the map.

An exemplary application of the method 100 is shown in FIGS. 2–6. FIG. 2 illustrates an exemplary testflow 200 for which testflow context information may be maintained. By way of example, the testflow 200 could be a system-on-a-chip testflow of the Agilent 93000 SOC Series tester (manufactured by Agilent Technologies, Inc. of Palo Alto, Calif., USA). The testflow 200 comprises two test suites 202, 204, respectively named "leakage2", and "leakage3". Each of the test suites 202, 204 serves to contain and/or specify a number of subtests, and may include one or more test controls (e.g., test methods, test functions or user procedures). By way of example, it is assumed that each of the test suites 202, 204 comprises three subtests, identified as "Leakage low", "Leakage high" and "Functional pre-test". Although subtests of the same name appear in each of the test suites 202, 204, the subtests need not be similarly named. Further, similarly named subtests in different test suites need not specify (and likely will not specify) the same subtest.

The testflow 200 also comprises a Loop 206. By way of example, the loop 206 specifies that it is to be iterated five times (i.e., 1 . . . 5).

FIG. 3 illustrates, in string form, a progression of testflow context information 300 that may be maintained by the method 100 during execution of the testflow 200. Note that the initial testflow context 302 is merely "leakage2", or the name of the first encountered test suite. After the test suite "leakage2" has been executed, the testflow context then changes to "L1", which is indicative of the first iteration of the Loop 206.

Upon entry into the test suite "leakage3", the testflow context then changes to "leakage3 : L1". Note that, for ease of reading, the testflow contexts shown in FIG. 3 adopt the convention of always placing the current test suite's name at the beginning of the context. However, this is certainly not required by the method 100, and need not be done.

Given that the strings included in the testflow context information 300 can be unwieldy to use as map keys (i.e., given that string comparisons usually take more time and processing resources than numeric index look-ups), the method 100 may maintain the testflow context information 300 as an array of context values. Thus, each time new testflow context information needs to be maintained by the method 100, it is determined whether the information is a string and, if so, a numeric equivalent of the string is looked up. FIG. 4 shows a database of look-up tables 400 wherein numeric equivalents are provided for testflow context information of the types [TestSuiteNames], [SubtestNames], [Vector Names] and [PinNames]. It is noted that the exemplary testflow 200 and testflow context information 300 do not provide any vector names or pin names and, thus, the database 400 does not show any entries in these tables. Preferably, the look-up tables 400 are adaptive, meaning that a string that does not yet appear in a corresponding look-up table is assigned a numeric equivalent that is then added to its corresponding look-up table.

Upon converting testflow context strings to their numeric equivalents, one of the "keys" formed by the method 100 might appear as shown in FIG. 5. Note that the Index array 502 of the key 500 is formed by adding a numeric identifier of the subtest named "Functional pre-test" (i.e., 2) to the array of context values respresenting the testflow context "leakge 3: L3". The Index array 502 is thus shown as [1, 3, 2].

The key 500 is also shown to comprise an array 504 of context types (i.e., [TestSuite, Loop, Subtest]), with each context type having a one-to-one correspondence with a context value in the Index array 502. Although context types may alternately be inferred from the number and positions of values in the Index array 502, the array 504 of context types can be useful in indexing a map of linked data nodes (as will be described in more detail later in this description).

Optionally, strings in the Type array 504 of key 500 may be converted to their numeric equivalents, similarly to how testflow context strings are converted to numeric equivalents. FIG. 6 therefore provides a context type look-up table 600 for making these conversions. Note that the table 600 may be a stand-alone table, or may be appended to the database of look-up tables 400. Using the table 600, the key 500*a* comprising an array 700 of "context type" values (i.e., [0, 1, 2]) may be derived.

The FIG. 1 method's maintenance of current testflow context information may further comprise the maintenance of a depth number. Such a depth number 506 is shown in the keys 500, 500*a* of FIGS. 5 & 7. The depth number 506 (i.e., numLayers=3) is equal to the number of values that are maintained in the Index and Type arrays 502, 504, and may be used to ensure that the key 500 is used to traverse only a fixed number of data nodes in a map of same. Further explanation of the purpose and use of a depth number 506 can be found later in this description.

Figure 8:
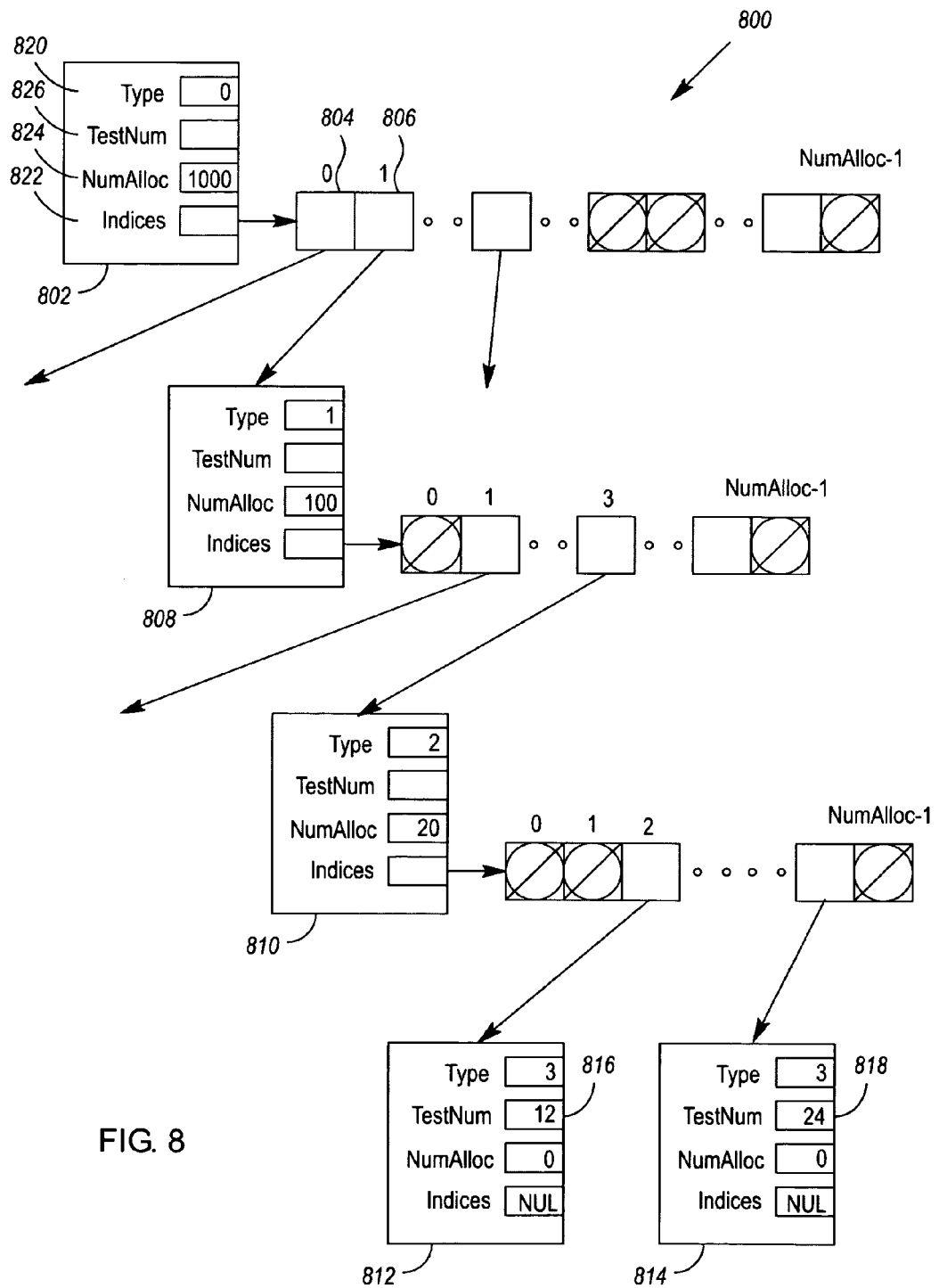
FIG. 8 illustrates an exemplary test number database that can be indexed by the FIG. 7 key.

FIG. 8 illustrates an exemplary test number database 800 that can be indexed by the key 500*a*. By way of example, the database 800 comprises a map of linked data nodes (e.g., nodes 802, 804, 806, 808, 810, 812, 814), at least one of which is a test suite node 802 that points to at least one other data node 804–808, and at least one of which is a test number node 812 that is pointed to by another data node 810. Each of one or more test numbers 816, 818 is associated with one of said test number nodes 812, 814.

Preferably, the data nodes 802–814 of the database 800 have a homogeneous structure. By way of example, the homogeneous structure may comprise a node type field 820, and an array 822 of child node indices. The node type field 820 may specify one of the context types found in table 600 (FIG. 6). The array 822 of child node indices may point to child data nodes 804–808 to which a parent data node 802 is linked.

If useful, each data node (e.g., 802) may comprise a field 824 that specifies how many child nodes (e.g., 804–808) have been allocated to the data node. Each data node 802–814 may also comprise a test number field 826. However, at least the test number data nodes 812, 814 comprise such a field.

The Index array 502 of the key 500*a* may be used to traverse a number of nodes 802, 808, 810, 812 of the map 800. If the map has already been traversed using the key 500*a*, the key 500*a* will eventually index a test number data node 812. The test number 816 that is associated with the node 812 can then be retrieved and associated with the result of a corresponding subtest in a testflow.

The Type array 700 and depth number 506 of the key 500*a* may be used, in one respect, as consistency checks to ensure that the correct type and number of nodes are being traversed. Additionally, if the key 500*a* specifies the traversal of an invalid node (e.g., one that has not yet been created, allocated or filled), the Type array 700 and depth number 506 may be used in combination with the Index array 502 to validate the invalid node (e.g., create, allocate or fill the data node).

FIG. 9 illustrates an exemplary database of test results 900 wherein each test result in the database is associated with a test number obtained by means of the method 100 and test number database 800. Although the test results shown in FIG. 9 are all presented in terms of "pass" or "fail", the test results of an actual test run could also or alternately comprise voltage readings, current readings, impedance measurements, and other sorts of test results.

During the first execution of a testflow (e.g., testflow 200 (FIG. 2)), much if not all of the database 800 and look-up tables 400, 600 may be created. The database 800 and tables 400, 600 may then be stored such that, upon subsequent execution of the same or similar testflow (e.g., an edited version of the testflow 200), the database 800 and tables 400, 600 may be used to streamline test number generation, and may be added to as the identification of new subtests requires.

Preferably, each of the subtests within a test suite is provided a unique subtest name, and enough testflow context information is maintained to ensure that each key used to index the map of linked data nodes 800 forms a unique subtest identifier. It is also preferred that each new test number entered into the map 800 is unique from all other test numbers in the map. However, the method 100 can often provide useful test numbers even when the above controls are not maintained.

Figure 10:
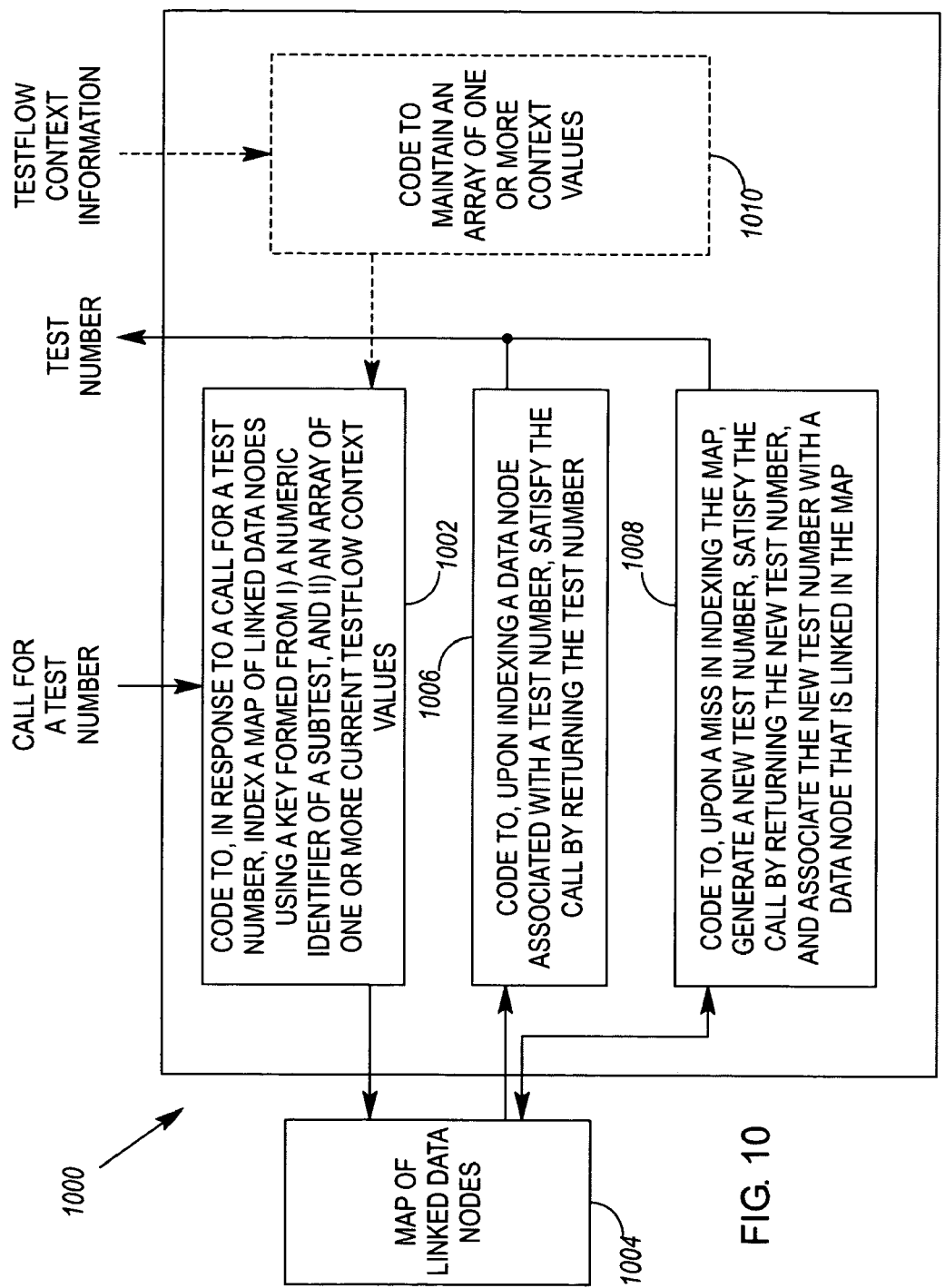
FIG. 10 illustrates an exemplary test number engine for returning test numbers in response to a call for same.

FIG. 10 illustrates a test number engine 1000 that, by way of example, can be used to implement the method 100. The test number engine 1000 is embodied in program code stored on computer readable media (e.g., a magnetic or optical disk, a fixed or removable disk, or random access or read-only memory (RAM or ROM)). In some embodiments, the program code of the test number engine 1000 may be distributed among various computer readable media associated with one or a plurality of computer systems.

As shown, the test number engine 1000 may comprise code 1002 to, in response to a call for a test number, index a map of linked data nodes 1004 using a key formed from 1) a numeric identifier of a subtest, and 2) an array of one or more current testflow context values. The test number engine 1000 may also comprise code 1006 to, upon indexing a data node associated with a test number, satisfy the call by returning the test number. The test number engine 1000 may further comprise code 1008 to, upon a miss in indexing the database 1004, generate a new test number, satisfy the call by returning the new test number, and associate the new test number with a data node in that is linked in the map. Optionally, the test number engine 1000 could also comprise code 1010 to maintain the array of current testflow context values. As part of maintaining the array, the code 1010 may use received testflow context strings to look up numeric equivalents of the strings.

In one embodiment, the method 100 and test number engine 1000 maintain an array of context values by pushing a context value into the array (e.g., via a "Push( )" operation) each time a new testflow context is entered. Upon leaving a testflow context, the testflow context may then be popped from the array (e.g., via a "Pop( )" operation). Testflow context values may therefore be maintained similarly to a data stack. However, some entries in the array may need to be incremented or otherwise manipulated. For example, upon repeated entry into a loop, a context value for the loop (e.g., a loop iteration number) may need to be incremented.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method for assigning test numbers, comprising:
   during execution of a testflow, maintaining current testflow context information as an array of one or more context values;
   upon execution of a subtest in the testflow, indexing a map of linked data nodes using a key formed from i) a numeric identifier of the subtest, and ii) said array of context values, and
   if a data node corresponding to the key exists in the map and is associated with a test number, assigning the data node's test number to a result of the subtest; and
   else, assigning a new test number to the result of the subtest, and associating the new test number with a data node that is linked in the map; and
   outputting the result of the subtest with the test number.

2. The method of claim 1, wherein said data nodes have a homogeneous structure.

3. The method of claim 2, wherein each of said homogeneous data nodes comprises a node type field, and an array of child node indices to which the data node is linked.

4. The method of claim 3, wherein each of said homogeneous data nodes further comprises a test number field.

5. The method of claim 1, wherein said key is formed by adding said numeric identifier of the subtest to said array of context values.

6. The method of claim 1, wherein said context values are integers.

7. The method of claim 1, wherein said context values are direct memory references.

8. The method of claim 1, wherein maintaining current testflow context information comprises:
   for each testflow context that is a string, using the string to look up a numeric equivalent of the string;
   if a numeric equivalent of the string is found, adding the numeric equivalent to said array of context values; and
   if a numeric equivalent of the string is not found, assigning a numeric equivalent to the string, adding the numeric equivalent to said array of context values, and adding the numeric equivalent and string to a look-up table.

9. The method of claim 1, wherein maintaining current testflow context information further comprises maintaining an array of context types, wherein said context types have a one-to-one correspondence with said context values.

10. The method of claim 9, wherein said array of context types is maintained as an array of context type values.

11. The method of claim 10, wherein:
   maintaining current testflow context information comprises i) for each testflow context that is a string, using the string to look up a numeric equivalent of the string, and ii) if a numeric equivalent of the string is found, adding the numeric equivalent to said array of context values; and
   maintaining said array of context type values comprises i) for each context type that is a string, using the string to look up a numeric equivalent of the string, and ii) if a numeric equivalent of the string is found, adding the numeric equivalent to said array of context type values.

12. The method of claim 9, wherein said key is further formed from a depth number that is equal to the number of values in said array of context values; said method further comprising using said depth number to traverse a fixed number of data nodes in said map.

13. The method of claim 1, further comprising, if said key specifies traversing an invalid node in said map, validating said node using at least part of said key.

14. A test number engine, comprising:
   computer readable media; and
   program code, stored on said computer readable media, comprising:
      code to, in response to a call for a test number, index a map of linked data nodes using a key formed from i)

a numeric identifier of a subtest, and ii) an array of one or more current testflow context values;

code to, upon indexing a data node associated with a test number, satisfy the call by returning the test number, and output the data node associated with the test number; and code to, upon a miss in indexing the map, generate a new test number, satisfy the call by returning the new test number, associate the new test number with a data node that is linked in the map, and output the data node linked in the map with the test number.

15. The test number engine of claim 14, wherein the program code further comprises code to maintain said array of current testflow context values.

16. The test number engine of claim 15, wherein the code to maintain said array uses received testflow context strings to look up numeric equivalents of said strings, said looked up numeric equivalents being pushed into said array of current testflow context values.

* * * * *